United States Patent

Liu

Patent Number: 5,158,862
Date of Patent: Oct. 27, 1992

[54] PROCESSLESS IMAGING TO MAXIMIZE BLUE LIGHT ABSORPTION OF AN IMAGE

[75] Inventor: Kou-Chang Liu, Wayne, N.J.

[73] Assignee: ISP Investments Inc., Wilmington, Del.

[21] Appl. No.: 829,815

[22] Filed: Feb. 3, 1992

Related U.S. Application Data

[62] Division of Ser. No. 601,535, Oct. 23, 1990.

[51] Int. Cl.$^5$ .................................................. G03C 5/56
[52] U.S. Cl. ..................................... 430/333; 430/293; 430/335; 430/346; 430/363; 430/365; 430/394; 430/945; 430/964
[58] Field of Search ............... 430/333, 293, 301, 335, 430/346, 363, 365, 394, 284, 945, 964

[56] References Cited

U.S. PATENT DOCUMENTS

| | | | |
|---|---|---|---|
| 3,723,121 | 3/1973 | Hauser et al. | 430/962 |
| 4,242,440 | 12/1980 | Yee et al. | 430/346 |
| 4,705,742 | 11/1987 | Lewis | 430/333 |
| 4,893,581 | 1/1990 | Matsuda et al. | 416/201 |
| 4,910,107 | 3/1990 | Kawada et al. | 430/21 |
| 4,960,679 | 10/1990 | Nakagiri et al. | 430/335 |

*Primary Examiner*—Charles L. Bowers, Jr.
*Assistant Examiner*—John A. McPherson
*Attorney, Agent, or Firm*—Marilyn J. Maue; Joshua J. Ward

[57] ABSTRACT

This invention relates to the preparation of a supported modulating film having a permanent orange yellow imaged layer of the homopolymer of crystralline 5,7-dodecadiyn-1,12-bis(isopropyl carbamate) monomer having the structure

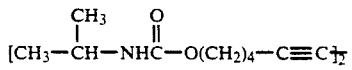

and to the use of said film as a blue light modulator in the production of master printing plates or printed circuit boards.

8 Claims, No Drawings

PROCESSLESS IMAGING TO MAXIMIZE BLUE LIGHT ABSORPTION OF AN IMAGE

This is a division of application Ser. No. 601,535, filed Oct. 23, 1990, now allowed.

In one aspect the invention relates to a permanent orange yellow imaged modulating or printing plate master film for improved negative image transfer by energy generated from a blue light source to a image receiving photoresist having a coating which is sensitive to blue light. In another aspect the invention relates to the preparation of said modulating film by a non-chemical process.

BACKGROUND OF THE INVENTION

Of the various light sources suitable for photoimaging including red, green and blue, blue light is the most economical and efficient. In general, the process of preparing a master printing plate having a photoresist layer involves passing energy from a light source through non-imaged portions of a modulator, e.g. a film imaged in a color which absorbs the transmitted light and transmits light radiation passing through non-imaged areas to the printing plate coated with a material which is imageable in discrete exposed areas upon exposure to radiant energy. Because of the ready availability and economy of blue light energy sources and the numerous films which are sensitive to blue light, extensive research has been directed to finding compounds which are imageable to a permanent yellow or orange yellow hue since such imaged compounds most efficiently absorb blue light and provide the highest duplicating properties. A yellow imaged modulating film would be capable of transferring energy from its non-imaged areas in a negative configuration of its pattern to a printing plate having a photoresist layer whereupon the photoresist layer develops color or is polymerized in the negative pattern dictated by the modulating film in the highest degree of acuity. Accordingly, a negative or positive of the desired image can be developed on the printing plate depending upon the yellow pattern or design inscribed on the modulating or master film.

Polyacetylenic compounds have enjoyed great popularity in imaging processes. However, it is well recognized that thermochromic behavior of polyacetylenic compounds is unpredictable and has been found only in certain narrow classes of this species. Further, within these classes, formation of a permanent yellow hue is extremely rare. While a few polyacetylenic monomers are capable of providing a yellow image at excessively high temperatures, this thermochromic effect is ephemeral, so that upon cooling, the image reverts to an initial transition color of darker shades e.g. red, blue, bronze, etc. (U.S. Pat. No. 3,501,303). Such color reversible compounds are useful as temperature or time-temperature indicators dependent on thermal changes but are not practical for use as modulating films in the preparation of printing plates, circuit boards and the like.

Accordingly, it is an object of this invention to provide a permanent yellow imaged film for use as a reverse image transmitting agent or master film in the production of printing plates and circuit boards.

Another object is to provide a commercially acceptable and economical chemically processless method for preparation of a permanent yellow imaged film.

Another object is to provide a commercially acceptable and economical process for using a permanent yellow imaged recording film as a master film in the production of printed circuit boards or master printing plates.

These and other objects of the invention will become apparent from the following description and disclosure.

THE INVENTION

In accordance with this invention there is provided a process which comprises exposing a supported layer of colorless, crystalline 5,7-dodecadiyn-1,12-bis(isopropyl carbamate) monomer having the formula

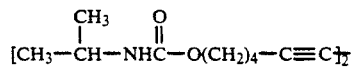

to short wavelength laser radiation in order to polymerize the monomer to a pink colored homopolymer and subjecting the resulting homopolymer layer to radiation at a longer wavelength from laser emissions, preferably focused to impinge discrete areas of the homopolymer in a predetermined pattern or design so as to form a permanent orange yellow image thereon. The laser operating at the long wavelength is one having sufficient beam power to directly or indirectly generate heat of at least 135° C., preferably between about 135° and about 200° C., in the exposed portions of the homopolymer. Laser emissions in a wavelength of 575 nm or less are directly absorbed by the homopolymer. However, the emissions of lasers generating energy in wavelengths above 575 nm, e.g. between about 600 and about 1,500 nm or more, are not absorbed; accordingly, in these cases an energy absorbing, heat transmitting agent is employed in conjunction with the diacetylene isopropyl carbamate monomer in the preparation of the initial film before coating on a substrate.

The colorless crystalline diacetylene isopropyl carbamate monomer of this invention is prepared by reacting hexyn-1-ol in an inert solvent with isopropyl isocyanate at between about 45° and about 60° C. for a period of from about 0.5 to about 10 hours and then reacting the intermediate N-(isopropyl)-5-hexyn-1-yl product with oxygen to induce oxidative coupling at a temperature of between about 35° and about 50° C. for a period of from about 0.5 to about 50 hours in the presence of a catalyst, e.g. cuprous chloride - tetramethyl ethylene diamine catalyst. The 5,7-dodecadiyn-1,2-bis(isopropyl carbamate) product is recovered by stripping solvent, washing with aqueous HCl and with water followed by distillation and drying to crystalline 5,7-dodecadiyn-1,12-bis(isopropyl carbamate) which is suitable for use as or in a coating composition applied to a substrate. The monomer is applied to the substrate in a coating thickness of from about 0.002 to 100 um, preferably from about 0.01 to about 10 um. Suitable substrates include polyethylene terephthalate, nylon, polystyrene, cellulose acetate, cellulose nitrate, cellophane, polyvinyl chloride, polyvinylidene chloride, teflon, polychlorotrifluoroethylene, polypropylene, paper, ceramic, glass, metal, wood and the like, however, for use as a modulating film, a transparent substrate is recommended.

Coatings of the present diacetylene isopropyl carbamate monomer in the presence or absence of an energy absorbing, heat transmitting agent, are applied to a substrate by any of the known techniques, including application of crystalline dispersions or of one or more monomolecular layers; however, an aqueous dispersion of the diacetylene isopropyl carbamate crystals fixed in any of the known binders is preferred. One or more monomolecular layers of the diacetylene isopropyl carbamate compound applied to the substrate by the Langmuir-Blodgett technique, spin or spray coating method is also suitable. Any energy absorbing, heat transmitting agent, which in certain situations may be required, can be applied as a separate, contiguous layer. The preparation of useful binder dispersions and coating techniques are more particularly described in my copending U.S. patent application Ser. No. 07/601,499, now U.S. Pat. No. 5,095,134. By way of illustration, a dispersion, emulsion or suspension of the crystalline diacetylene isopropyl carbamate/binder, preferably an aqueous dispersion with a binder, is prepared under atmospheric conditions by mixing the crystalline diacetylene isopropyl carbamate crystals in a binder solution optionally containing an energy absorbing, heat transmitting agent, until a uniformly dispersed, suspended or emulsified liquid mixture is obtained. The mixture is then processed by known procedures e.g. chilled or frozen by the process described in U.S. Pat. No. 4,784,934 to provide a dispersion of microcrystals in a binder. The diacetylene isopropyl carbamate crystals have a diameter of from about 0.02 um to about 5 um, preferably from 0.1 um to 1.0 um, and are fixed in the binder to provide a uniform dispersion containing from about 1 to about 50 wt. %, preferably from about 4 to about 15 wt. % of solid microcrystals. This dispersion is then coated on a substrate and dried to form a layer of between about 0.3 to about 100, preferably 0.5 to 10 um thickness. Monomolecular layers of the diacetylene isopropyl carbamate are, of course, much thinner; however a plurality of monomolecular layers as well as one or more layers of the energy absorbing component, when needed, can be sequentially applied to any thickness desired.

\* entitled THERMOCHROMIC DIACETYLENE ETHERS CONTAINING ESTER OR URETHANE GROUPS, filed concurrently herewith The resulting dried diacetylene isopropyl carbamate film is then imaged by the process of this invention which comprises, in a first stage of a preferred two stage process, exposing the film, at ambient temperature and pressure to short wavelength radiation; i.e. at a wavelength of between about 200 and about 350 nm, to instantly polymerize the diacetylene isopropyl carbamate to a pink colored homopolymer. Short wavelength exposure is effected by a UV laser, e.g. an argon ion laser transmitting energy at about 275 nm wavelength, a xenon flash lamp, a mercury arc lamp, a tungsten quartz halogen lamp, a krypton ion laser, a GaAlP laser, electron beam, $\gamma$-rays, X-rays, $\beta$-rays, $\alpha$-particles, neutrons, electron corona discharge, UV light and the like. The short wavelength exposure can be employed to homopolymerize all or a portion of the diacetylene isopropyl carbamate film. For example, UV light can be used to homopolymerize the entire colorless diacetylene isopropyl carbamate layer (case a) or the layer can be scribed, in one or several steps to define a predetermined pattern or image with the short wavelength transmitting device, e.g. a UV laser or electron beam operated in a writing mode (case b). In case (a), the entire film acquires the pink color of the homopolymer; whereas in case (b) a homopolymerized pink image is inscribed on the colorless background of the unexposed diacetylene isopropyl carbamate. The various UV lasers which may be employed in case (a) or (b) have an output power of between about 5,000 and about 15,000 mW with effective dwell time of from about 0.01 to about 5 seconds. In the writing mode, exposure with an electron beam is carried out under vacuum of from about $10^{-3}$ to about $10^{-9}$ torr, preferably from about $10^{-5}$ to about $10^{-8}$ torr, using a beam diameter of from abut 0.1 to about 25 nm, an energy of from about 10 to about 30 KeV, and a current flow of from about $10^{-9}$ to about $10^{-6}$ amps. The beam is adapted to scan the target area at a fast rate, e.g. a dwell time of between about $10^{-3}$ and about $10^{-8}$ second. UV light exposure with a wavelength up to about 385 nm, e.g. 200-350 nm, an intensity of from about 5,000 to about 15,000 mW for a dwell time of from about 0.1 second to about 10 minutes is also effective for polymerizing the diacetylene isopropyl carbamate to produce the blue colored homopolymer. Equivalent dosages are employed for alternate sources of short wavelength exposures.

The resulting homopolymerized film is then subjected to laser emissions at a longer wavelength of at least about 450 nm in the second stage of the reaction. The laser employed is a laser capable of generating heat sufficient to raise the temperature of the homopolymer in the exposed areas to between about 135° and about 200° C., preferably between about 140° and about 180° C., thus causing a permanent color change from pink to orange-yellow in the areas impinged by the longer wavelength laser emission. In case (a) above, the laser operating at the longer wavelength is employed in the writing mode to inscribe a predetermined permanent yellow image on the pink colored homopolymer layer. In case (b) above, the longer wavelength laser can be synchronized with the scribing device operating at a short wavelength and used in the writing mode to retrace the previously inscribed image or it can be used to expose the entire polymerized and non-polymerized portions of the diacetylene isopropyl carbamate layer so as to induce a change to a permanent yellow color to the preinscribed pink image. This operation is carried out under ambient pressure for a period sufficient to complete the color transition, which time period is dependent upon the laser beam power and type of laser imaging device selected. The heat generation can be supplied by substantially any laser generating energy in the 450 nm or longer wavelength regions of the spectrum. Such lasers include a compact semi-conductor diode, solid state, gas, metal vapor, or dye laser. However, semi-conductor diode lasers, having an output power of from about 1 microwatt to about 10 watts, are preferred. Specific examples of suitable lasers include GaAlAs, NaYtAl garnet, Ar, He-Ne, He-Cd, GaAs NeYAl garnet, ruby, NaYAg, krypton ion, copper vapor lasers, etc. Thus, crystalline, gas or amorphous solid, pulsed or continuous wave lasers may be used. For scribing, a laser beam diameter of 0.5 to about 2 nm with an exposure time of from about 180 to 250 ns/dot and an output of 2.5-3.5 mW is generally employed to create an orange yellow image of high resolution.

The laser selected should be capable of transmitting the heat needed to induce a thermochromic color change in the laser exposed areas at between about 450 and about 575 nm wavelength, which is within the direct absorption capability of the homopolymer. Alternatively, a laser transmitting energy at a longer infrared wavelength, for example above about 575 up to about 1,500 nm or higher can be employed, provided that a suitable energy absorbing, heat transmitting component, such as an energy absorbing polycarbocyanine dye, a pyrylium dye, a squarilium dye or mixtures and intermixtures of dyes as described in more detail in copending U.S. patent application Ser. No. 07/601,537,* is used in conjunction with the diacetylene isopropyl carbamate to absorb energy from the laser and to transmit sufficient heat to the polymer so that a permanent yellow image or pattern is inscribed thereon. The energy absorbing, heat transmitting agent is one having absorption capability in a wavelength similar to the transmitting laser and is capable of raising the temperature of the homopolymer to at least 135° C. When an energy absorbing dye is employed, the weight ratio of diacetylene isopropyl carbamate polymer to dye can vary between about 1000:1 and about 1:10, depending upon the amount of homopolymer present and the amount of radiation energy needed to be converted to heat energy. Most often the dye comprises between about 0.005 and about 1 wt. % of the imageable compound.

* by David F. Lewis, entitled LASER IMAGEABLE COMPOSITION and filed concurrently herewith In another embodiment of this invention, dual laser exposures can be effected with a single laser unit wherein a short in advance of a long wavelength energy generating laser is mounted. Because of the time lag in generating heat, as opposed to instantaneous polymerization, the laser emissions from the two beams, in synchronized phase, may be focused to impinge simultaneously on each pixel of the imageable layer for direct recording of a yellow image.

The diacetylene isopropyl carbamate homopolymer of this invention is unique and its properties are not shared with its isomer or adjacent homolog since 5,7-dodecadiyn-1,12-bis(n-propyl carbamate) cannot be imaged to a yellow color and instead develops a permanent red color. The 5,7-dodecadiyn-1,12-bis(t-butyl carbamate) is insensitive to radiation.

The resulting permanent orange yellow imaged film product supported on a transparent substrate can be employed as a master film in the preparation of a printing plate or etch resist coated with a layer which is photosensitive to blue light transmission.

The image receptive device, e.g. an etch resist for a printed circuit board, a master printing plate, etc. can be composed of any durable support material such as metal, glass, ceramic, polyester, and the like which is coated with a photosensitive layer, comprised of any known photosensitive materials which undergo polymerization or chromic change in response to radiation from a blue light source. Of these materials, colorless, thermochromic conjugated polyacetylenic monomers, their monomeric derivatives, diazo resins, cinnamic ester resins, polymethacrylates or a silver halide based film are suitable; however, crystalline, imageable diacetylene derivatives are preferred. Examples of preferred diacetylenic compounds comprising the photosensitive surface layer of the image receiving device include any of the art recognized hydrocarbon diacetylenes, and their derivatives such as the carboxyl, amino, amido, ester, ether, urea or carbamate substituted diacetylenes as well as tri- and tetra- acetylene derivatives of these species.

The homopolymerized diacetylene isopropyl carbamate of the present invention has other uses in addition to photoimaging. For example this homopolymer is useful as time-temperature or temperature indicator coatings as warming means for equipment which is subject to overheating. However, the photoimaging application of the homopolymer is emphasized since this product possesses unusual properties such as a permanent orange yellow thermochromic imaging and chemical processless development to images of superior resolution and intensity, which are so important in the photographic arts.

Having generally described the invention, reference is now had to the accompanying examples which are presented to illustrate preferred embodiments but which are not to be considered as limiting to the scope of this invention as is more broadly described above and in the appended claims.

EXAMPLE 1

A. Preparation of 5,7-dodecadiyn-1,12-bis(isopropyl carbamate)

5-Hexyn-1-ol (98.2 g, 1.5 moles), tetramethylethylenediamine (30 g) and tetrahydrofuran (235 ml) were charged into a 1 liter flask which was equipped with a mechanical stirrer, thermometer, gas inlet, and a condenser. The solution was heated to 50° C. under a nitrogen blanket and a solution of isopropyl isocyanate (98.6 g, 1.16 moles) in 50 ml of tetrahydrofuran was added through the dropping funnel to the vigorously stirred solution at 50° to 55° C. over a period of one hour, and held for 6 additional hours before cooling to 40° C. Cuprous chloride (3 g) was then added and oxygen was bubbled through the solution at 40°-45° C. for 38 hours. The solvent was then stripped off under vacuum and the resulting solid material was washed twice with 300 ml of 10% HCl, two times with 300 ml of distilled water before air drying to yield 146 g of 5,7-dodecadiyn-1,12-bis (isopropyl carbamate) product, m.p. 131°-135° C. The structure of the diacetylene isopropyl carbamate was identified by nmr and IR analyses.

B. Preparation of Coating Dispersion

In a glass container, 1.2 g. of the above product were dissolved at about 50° C. in 3.6 g. of ethyl acetate and the resulting solution was filtered and designated Solution A. A second solution, designated Solution B, was prepared by dissolving 1.2 g. of photographic gelatin and 0.05 g. of ALKANOL XC (an alcohol-containing wetting agent, supplied by E. I. duPont) in 30 g. of water. Solution B was heated to 60° C. and introduced into a 250 ml Waring Blender. While blending at high speed, Solution A was added to Solution B after which the blending was continued for 2 minutes. The resulting mixture was then poured into a crystallizing dish to chill set at about 12° C. The resulting gelled dispersion was then cut into approximately 1 cm cubes and allowed to warm in an air stream at approximately 32° C. to remove ethyl acetate by evaporation. After the ethyl acetate had been removed, the gelled dispersion was reconstituted by melting at 40° C. and adding sufficient water to replace the weight loss that occurred during drying.

C. Coating a Film Base with Dispersion

The reconstituted dispersion was coated at about 8 micrometers thickness on a poly(ethylene terephthalate) film base which had been overcoated with a 1 micrometer thick layer of an adhesion promoting material composed of about 50 wt. % gelatin and 50 wt. % of a latex polymer. The coated film was then allowed to dry in air at ambient temperature.

D. Imaging the Film

A 4×4 inch sample of the above film is placed in a holding device over which is mounted an argon ion laser having a 2 nW output and emitting radiation at a maximum wavelength of about 275 nm. The colorless film is exposed for 0.1 second so as to absorb energy and polymerize the colorless 5,7-dodecadiyn-1,12-bis(isopropyl carbamate) to a pink homopolymer.

The resulting homopolymer is then scribed with a copper vapor laser having an output of about 100 watts which transmits energy at about 560 nm wavelength and impinges discrete areas of the surface of the film defined by a series of diamond shaped figures and lines. The energy generated by this transmission is absorbed by the homopolymer and heats the exposed areas of the film to a temperature of about 145° C. in a fraction of a second whereby an image of said pink diamond and line figure is converted to a permanent bright orange yellow color in high image acuity.

E. Use of the Yellow Imaged Film as a Modulating Film

The above sample is employed as a modualting film in the following test. A blue light source, i.e. a high pressure mercury arc lamp operating at an output power of 1 kilowatt and transmitting energy in a wavelength of 350-450 nm is focused to scan the entire area of the film sample which is positioned about 3.6 feet from the light outlet. Contiguous with the surface of the film and on the surface directly opposite the surface being radiated, is positioned the imageable surface layer, i.e. 4-diazodiphenylamine/formaldehyde condensate, supported on cellulose triacetate sheet of the photoresist master printing plate.

The blue light from the lamp is absorbed in the imaged areas of the film sample and is transmitted from the non-imaged areas, in an exact negative imaged pattern to the imageable surface layer of the photoresist where it attacks the polymer condensate and renders the decomposed areas insoluble in water.

EXAMPLE 2

Example 1 is repeated except that in Part B, 0.1 wt. % of IR-125 dye (a polycarbocyanine dye supplied by Eastman Kodak) is added to solution B and a GaAlAs semiconductor diode laser with a wavelength of about 830 nm is substituted for the copper vapor laser in Part D. The image produced is one of high resolution defined in a bright orange yellow color on a pink colored background.

EXAMPLE 3

Example 1 is repeated except that in part D, the argon ion laser is employed in the writing mode and used to instantly inscribe lines on the homopolymerized diacetylene carbamate, visible in a pink color on the unexposed colorless diacetylene isopropyl carbamate background. After about 1 hour, dots between the pink lines are inscribed with the argon ion laser to provide a pink image of lines and dots on the unexposed colorless background. Also in Part D a broad exposure of the entire film is made with the copper vapor laser instead of impinging discrete areas. Within a fraction of a second, the pink lines and dots are converted to a bright orange yellow image of high acuity.

EXAMPLE 4

Parts A, B and C of Example 1 are repeated to provide an imageable film. A 4×6 inch sample of this film is mounted in a holding device over which is positioned a first imaging device as an argon ion laser, and a second imaging device as a copper vapor laser; said lasers adapted to operate in phase. Both lasers in a writing mode are focused to impinge each pixel of the imageable film layer simultaneously so as to transmit a predetermined image of dots and lines in a linear pattern. Within a second, bright orange yellow image in high acuity is transmitted on the colorless background of the film.

EXAMPLE 5

Example 1, parts A, B and C are repeated, except that, in part A, t-butyl isocyanate is substituted for isopropyl isocyanate and the product is 5,7-dodecadiyn-1,12-bis(t-butyl carbamate).

Part D of Example 1 is also repeated, except that the colorless 5,7-dodecadiyn-1,12-bis(t-butyl carbamate) film is exposed for 1 hour during which time no color change is observed; thus this compound is not homopolymerized.

EXAMPLE 6

Example 1, parts A, B and C are repeated except that, in part A, n-propyl isocyanate is substituted for isopropyl isocyanate and the product is 5,7-dodecadiyn-1,12-bis(n-propyl) carbamate.

Part D of Example 1 is also repeated, except that this film homopolymerized to blue at the short wavelength (275 nm) and the blue homopolymer in the laser exposed areas undergoes a chromic change to red.

It is to be understood that many modifications and substitutions can be made in the above examples without departing from the scope of this invention. For example, any of the other laser devices which transmit energy in the longer wavelength above 400 nm can be substituted in the above examples in accordance with the teachings of this invention. Also any of the energy absorbing heat transmitting dyes including other polycarbocyanine dyes, squarilium or pyrilium dyes and dye complexes mentioned or described in copending U.S. patent application No. 601,532 filed Oct. 23, 1990, filed concurrently herewith, and in U.S. Pat. No. 4,513,071 which absorb energy in a wavelength similar to that of the energy generated from the laser can be substituted in the above examples or examples indicated by the above substitutions. Additionally, substitutions of other base films in Parts C and Parts E of the above examples or substituted examples, as well as other photoresist coatings for the image receiving device in Parts E can be made without departing from the scope of this invention.

What is claimed is:

1. The process of forming a permanent orange yellow image on a film having a transparent film base and an imaging layer of colorless diacetylene isopropyl carbamate having the formula

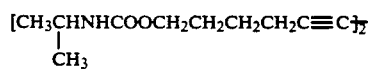

which comprises exposing at least a portion of said film to a source of radiation transmitted in a relatively short wavelength of from about 200 to about 350 nm to homopolymerize said diacetylene isopropyl carbamate monomer in the exposed portions to a pink color and exposing the homopolymer to emissions from a laser generating energy at a longer wavelength of at least 450 nm to induce a thermochromic color change from pink to a permanent orange yellow in the laser exposed areas of the homopolymer and inscribing an image on said film at either said short wavelength or said longer wavelength.

2. The process of claim 1 wherein a precise predetermined image is inscribed at the short wavelength on the diacetylene isopropyl carbamate layer in a pink color by writing at a short wavelength with an ultraviolet radiation writing device followed by laser radiation of the image at the longer wavelength to convert said pink image to a permanent golden yellow color on a colorless background.

3. The process of claim 2 wherein said ultraviolet radiation writing device is an electron beam or a UV laser.

4. The process of claim 1 wherein UV light at a short wavelength is employed to homopolymer the entire layer of said diacetylene isopropyl carbamate to a pink color and a laser in the writing mode is employed at the longer wavelength to inscribe a precise predetermined image in a golden yellow color on the pink homopolymer.

5. The process of claim 4 wherein said UV light at a short wavelength is transmitted by a UV laser device in a dual laser imaging process.

6. The process of claim 1, wherein the imageable layer of diacetylene isopropyl carbamate is in contact with an energy absorbing, heat transferring dye having absorption in the wavelength range of from about 575 and about 1500; said dye selected from the group of a polycarbocyanine dye, a pyrylium dye and a squarillium dye.

7. The process of claim 2, wherein the imageable layer of diacetylene isopropyl carbamate is in contact with an energy absorbing, heat transferring dye having absorption in the wavelength range of from about 575 to about 1500; said dye selected from the group of a polycarbocyanine dye, a pyrylium dye and a squarillium dye.

8. The process of claim 4, wherein the imageable layer of diacetylene isopropyl carbamate is in contact with an energy absorbing, heat transferring dye having absorption in the wavelength range of from about 575 and about 1500; said dye selected from the group of a polycarbocyanine dye, a pyrylium dye and a squarillium dye.

* * * * *